(12) United States Patent
Hsieh (10) Patent No.: US 8,378,392 B2
(45) Date of Patent: Feb. 19, 2013

(54) TRENCH MOSFET WITH BODY REGION HAVING CONCAVE-ARC SHAPE

(75) Inventor: Fu-Yuan Hsieh, Banciao (TW)

(73) Assignee: Force Mos Technology Co., Ltd. (TW)

( * ) Notice: Subject to any disclaimer, the term of this patent is extended or adjusted under 35 U.S.C. 154(b) by 263 days.

(21) Appl. No.: 12/662,241

(22) Filed: Apr. 7, 2010

(65) Prior Publication Data

US 2011/0248340 A1 Oct. 13, 2011

(51) Int. Cl.
*H01L 27/088* (2006.01)
(52) U.S. Cl. ........ 257/270; 257/142; 257/197; 257/268; 438/213; 438/288; 438/327; 438/328
(58) Field of Classification Search .................... 257/334
See application file for complete search history.

(56) References Cited

U.S. PATENT DOCUMENTS

| | | | | |
|---|---|---|---|---|
| 5,929,481 A * | 7/1999 | Hshieh et al. | ................. | 257/328 |
| 6,084,264 A * | 7/2000 | Darwish | ...................... | 257/329 |
| 6,291,298 B1 * | 9/2001 | Williams et al. | .............. | 438/270 |
| 6,372,557 B1 * | 4/2002 | Leong | ............................ | 438/142 |
| 6,569,738 B2 * | 5/2003 | Darwish | ...................... | 438/270 |
| 6,600,193 B2 * | 7/2003 | Darwish | ...................... | 257/330 |
| 6,710,403 B2 * | 3/2004 | Sapp | ............................. | 257/330 |
| 6,764,906 B2 * | 7/2004 | Darwish | ...................... | 438/270 |
| 6,875,657 B2 * | 4/2005 | Yue et al. | ....................... | 438/270 |
| 7,061,047 B2 * | 6/2006 | Ono et al. | ...................... | 257/330 |
| 7,084,456 B2 * | 8/2006 | Williams et al. | .............. | 257/329 |
| 2001/0000033 A1 * | 3/2001 | Baliga | .......................... | 438/270 |
| 2003/0008460 A1 * | 1/2003 | Darwish | ...................... | 438/268 |
| 2004/0021174 A1 * | 2/2004 | Kobayashi | .................... | 257/330 |
| 2004/0038481 A1 * | 2/2004 | Darwish | ...................... | 438/272 |
| 2005/0035398 A1 * | 2/2005 | Williams et al. | .............. | 257/329 |
| 2005/0215011 A1 * | 9/2005 | Darwish et al. | .............. | 438/270 |
| 2006/0014349 A1 * | 1/2006 | Williams et al. | .............. | 438/270 |
| 2006/0019448 A1 * | 1/2006 | Darwish et al. | .............. | 438/270 |
| 2006/0038223 A1 * | 2/2006 | Darwish | ...................... | 257/330 |
| 2006/0121676 A1 * | 6/2006 | Darwish | ...................... | 438/272 |
| 2008/0023759 A1 * | 1/2008 | Zeng | ............................. | 257/334 |
| 2008/0035987 A1 * | 2/2008 | Hebert | .......................... | 257/330 |
| 2008/0124870 A1 * | 5/2008 | Park | ............................. | 438/270 |
| 2008/0199997 A1 * | 8/2008 | Grebs et al. | ................... | 438/270 |
| 2009/0008706 A1 * | 1/2009 | Yedinak et al. | ............... | 257/328 |
| 2009/0127593 A1 * | 5/2009 | Bhalla et al. | .................. | 257/263 |
| 2009/0140327 A1 * | 6/2009 | Hirao et al. | .................... | 257/328 |
| 2009/0159989 A1 * | 6/2009 | Hong | ............................. | 257/408 |
| 2009/0189218 A1 * | 7/2009 | Pan | ............................... | 257/330 |
| 2009/0246923 A1 * | 10/2009 | Park | ............................. | 438/270 |
| 2010/0200912 A1 * | 8/2010 | Hsieh | ........................... | 257/329 |
| 2010/0219462 A1 * | 9/2010 | Darwish et al. | .............. | 257/329 |
| 2010/0264488 A1 * | 10/2010 | Hsieh | ........................... | 257/334 |
| 2010/0267211 A1 * | 10/2010 | Kobayashi et al. | ........... | 438/270 |
| 2010/0276728 A1 * | 11/2010 | Hsieh | ........................... | 257/139 |
| 2011/0108914 A1 * | 5/2011 | Denison et al. | ............... | 257/337 |
| 2011/0312138 A1 * | 12/2011 | Yedinak et al. | ............... | 438/270 |
| 2012/0032261 A1 * | 2/2012 | Hsieh | ........................... | 257/334 |
| 2012/0064684 A1 * | 3/2012 | Hsieh | ........................... | 438/270 |

* cited by examiner

*Primary Examiner* — Wai Sing Louie
*Assistant Examiner* — William Harriston
(74) *Attorney, Agent, or Firm* — Bacon & Thomas, PLLC (57) ABSTRACT

A trench Metal Oxide Semiconductor Field Effect Transistor with improved body region structures is disclosed. By forming the inventive body region structures with concave-arc shape with respect to epitaxial layer, a wider interfaced area between the body region and the epitaxial layer is achieved, thus increasing capacitance between drain and source Cds. Moreover, the invention further comprises a Cds enhancement doped region interfaced with said body region having higher doping concentration than the epitaxial layer to further enhancing Cds without significantly impact breakdown voltage.

12 Claims, 11 Drawing Sheets

TRENCH MOSFET WITH BODY REGION HAVING CONCAVE-ARC SHAPE

FIELD OF THE INVENTION

This invention related generally to the cell structure and device configuration of power semiconductor devices. More particularly, this invention relates to trench MOSFETs (Metal Oxide Semiconductor Field Effect Transistor) with improved cell structure and device configuration to achieve high efficiency.

BACKGROUND OF THE INVENTION

Figure 1:
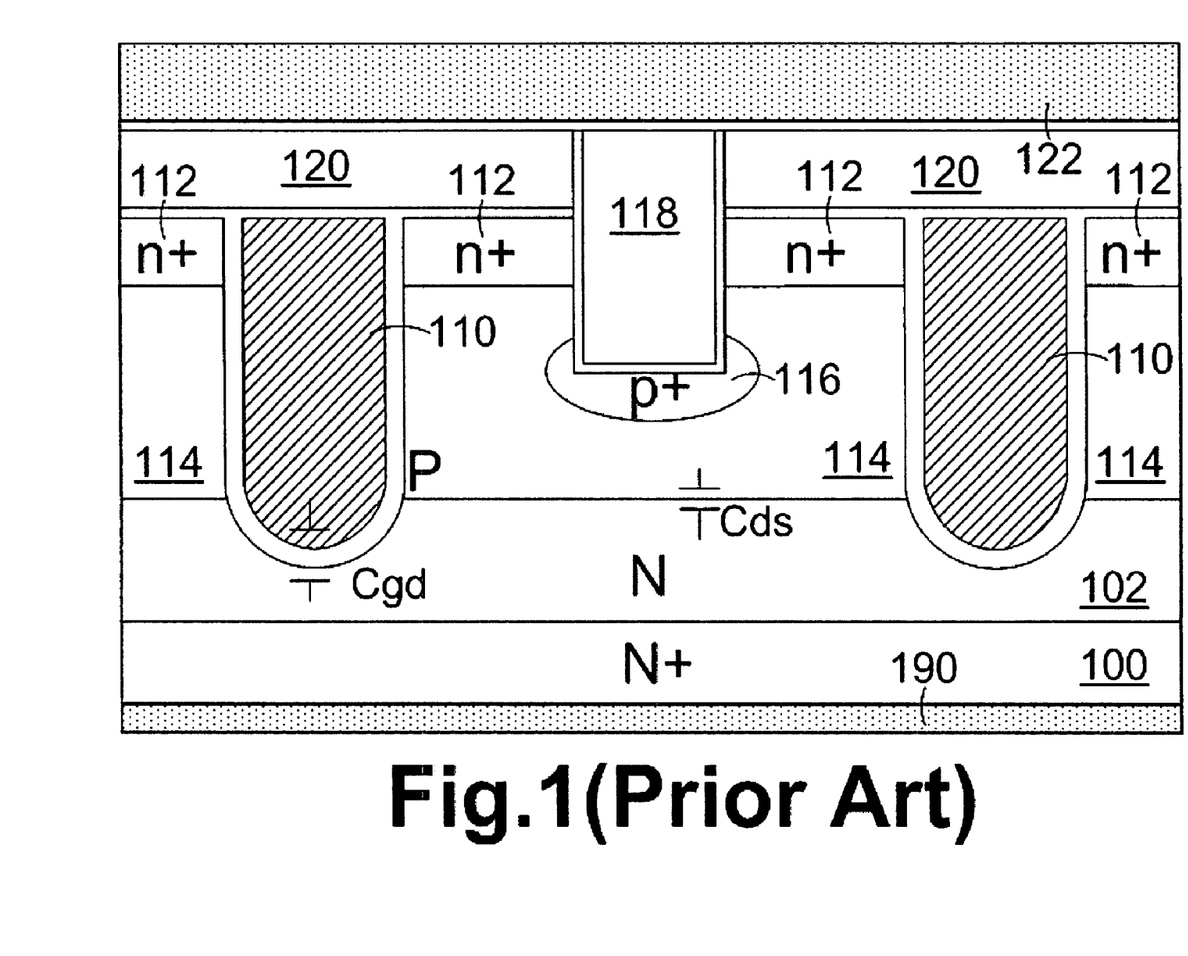
FIG. 1 is a side cross-sectional view of a trench MOSFET of prior art.

In U.S. Pat. No. 6,888,196, a conventional structure with trenched source-body contact structure of a trench MOSFET is disclosed, as shown in FIG. 1, wherein an N-channel trench MOSFET comprising a plurality of trenched gates 110 surrounded by n+ source regions 112 encompassed in P body regions 114 is formed in an N epitaxial layer 102 over an N+ substrate 100 coated with back metal 190 as drain. To connect said source regions 112 and said body regions 114 to a source metal 122, a trenched source-body contact 118 is employed penetrating through a contact interlayer 120, said n+ source regions 112 and extending into said P body regions 114. Furthermore, a p+ body ohmic contact doped region 116 is implanted surrounding bottom of said trenched source-body contact 118 to decrease a contact resistance between said P body regions 114 and said trenched source-body contact 118.

The conventional structure in FIG. 1 is encountering a technical difficulty which is that the trenched source-body contact 118 causes significant reduction in output capacitance Coss as explained below, thus impacts DC-DC application issue. However, in the DC-DC application, PWM (Pulse-Width Modulation) IC can not match well with the device with low Coss, hence resulting in low efficiency.

As we all know that, in a trench MOSFET, the output capacitance Coss=Cds+Cgd, where Cds is capacitance between drain and source, and Cgd is capacitance between gate and drain, as illustrated in FIG. 1. The Coss reduction mentioned above is mainly due to the Cds reduction as result of reduction in mesa area between two adjacent trenched gates when trench width of the trenched source-body contact structure is shrunk. Therefore, in order to increase the Coss, it is a key point to increase the Cds which is proportional to Ba/Dw, where Ba is area of body region interfaced with the epitaxial layer between two adjacent trenched gates and Dw is total depletion width in the body region and the epitaxial layer at the interface which is inversed to doping concentration of the body region and the epitaxial layer at the interface.

Accordingly, it would be desirable to provide new and improved power semiconductor devices to avoid the constraint discussed above.

SUMMARY OF THE INVENTION

The present invention has been conceived to solve the above-described problems with the related art, and it is an object of the invention to provide a technique which makes it possible to enhance the Cds in a trench MOSFET to further increase the Coss to achieve a higher efficiency.

In order to solve the above-described problems, according to a first aspect of the invention, there is provided a trench MOSFET comprising: a substrate of a first conductivity doping type; an epitaxial layer of said first conductivity doping type over said substrate; a plurality of trenched gates; a plurality of source regions of said first conductivity doping type surrounding top portion of said trenched gates, said source regions have higher doping concentration than said epitaxial layer; a plurality of body regions of a second conductivity doping type encompassing said source regions, said body regions have concave-arc shape with respect to top surface of said epitaxial layer; a plurality of trenched source-body contacts; a plurality of body ohmic contact doped regions of said second conductivity doping type surrounding at least bottoms of said trenched source-body contacts.

According to a second aspect of the present invention, there is provides a trench MOSFET further comprising a plurality of Cds enhancement doped regions of said first conductivity doping type interfaced with said body regions, said Cds enhancement doped regions are formed under said body regions and have higher doping concentration than said epitaxial layer.

Figure 2:
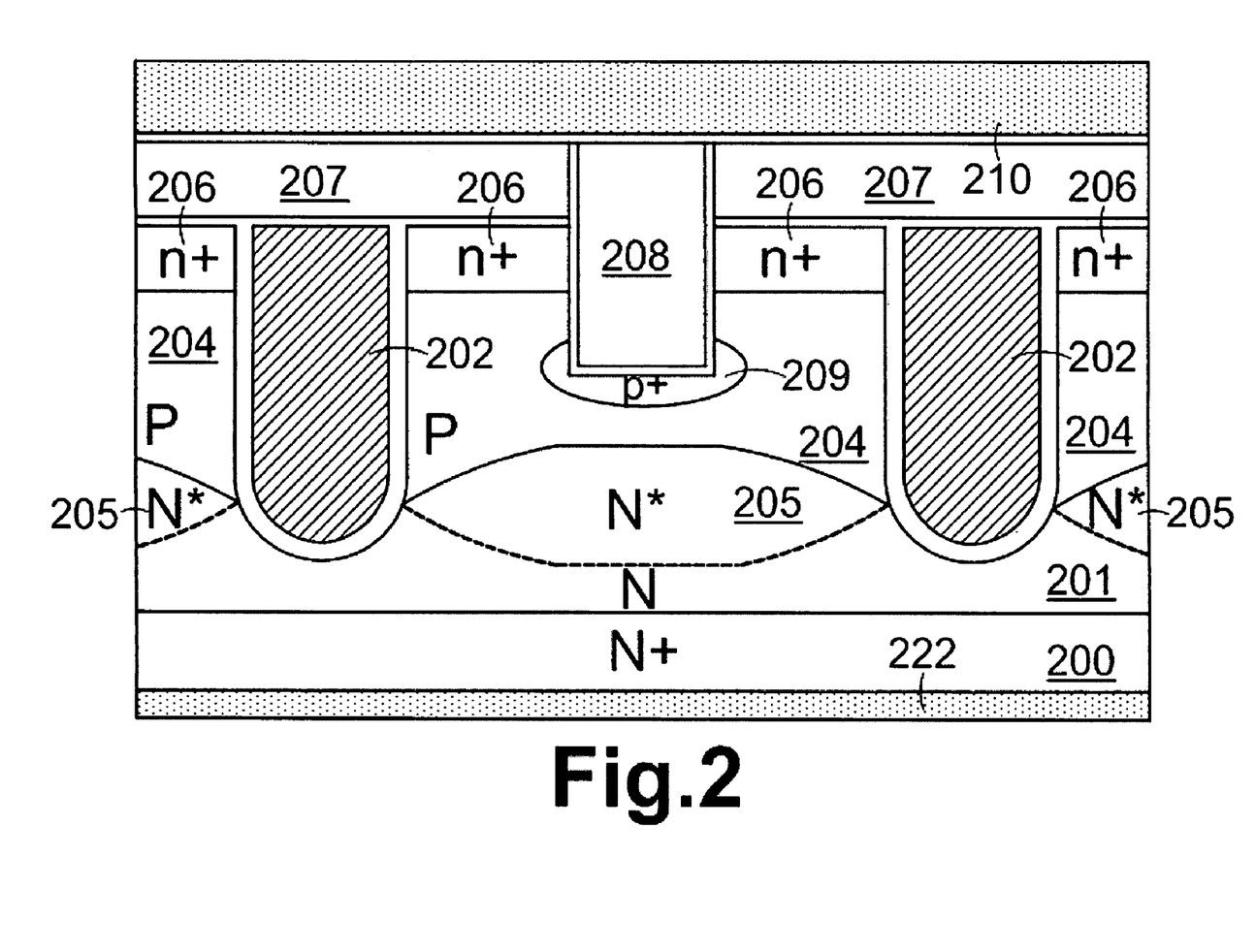
FIG. 2 is a side cross-sectional view of a preferred embodiment according to the present invention.

According to a third aspect of the present invention, there is provided a trench MOSFET wherein said Cds enhancement doped regions described in the second aspect are not touching to said body ohmic contact doped regions, as shown in FIG. 2.

Figure 3:
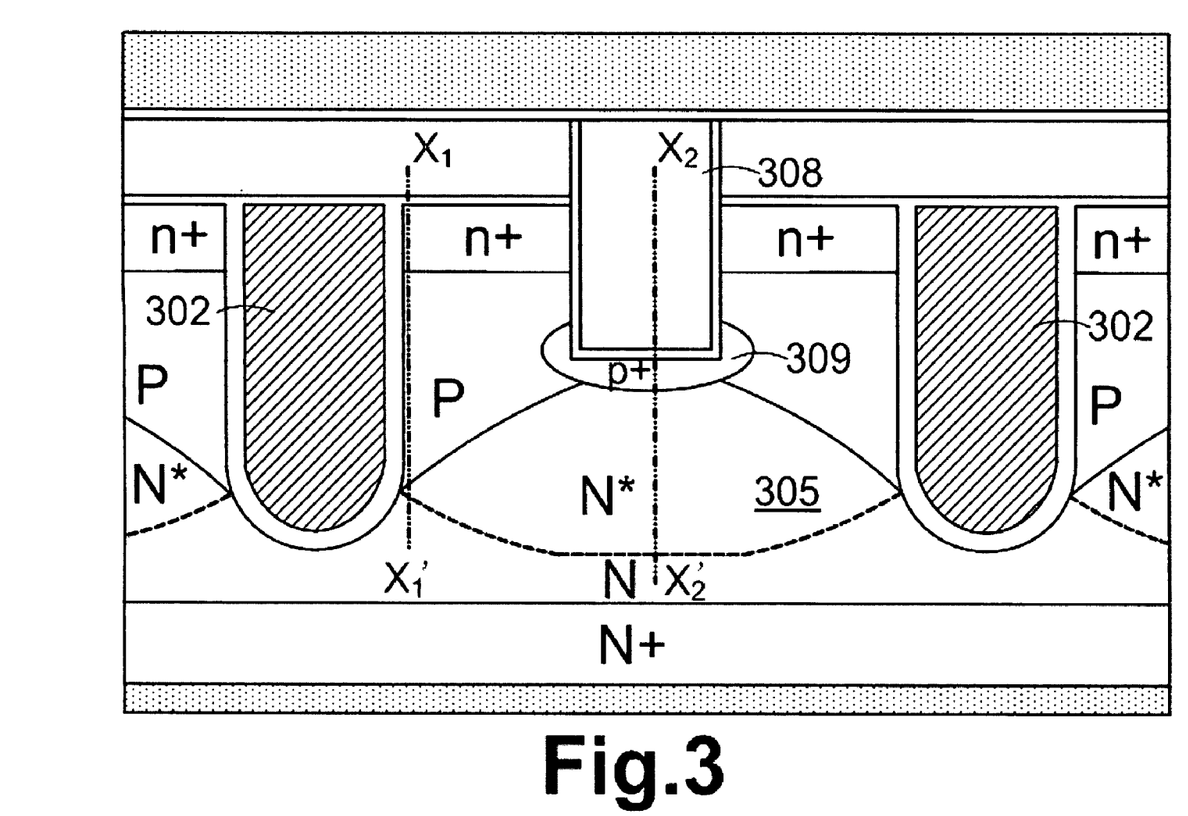
FIG. 3 is a side cross-sectional view of another preferred embodiment according to the present invention.

According to a fourth aspect of the present invention, there is provided a trench MOSFET wherein said Cds enhancement doped regions described in the second aspect are touching to said body ohmic contact doped regions, as shown in FIG. 3.

According to a fifth aspect of the present invention, there is provided a trench MOSFET wherein said Cds enhancement doped regions described in the second aspect are formed by ion implantation of Phosphorus through regions of the trenched source-body contacts.

According to a sixth aspect of the present invention, there is provided a trench MOSFET wherein said trenched gates are filled with doped poly-silicon layer padded by a gate oxide layer, and said doped poly-silicon layer is not higher than top surface of said source regions, as shown in FIG. 2~FIG. 6.

Figure 7:
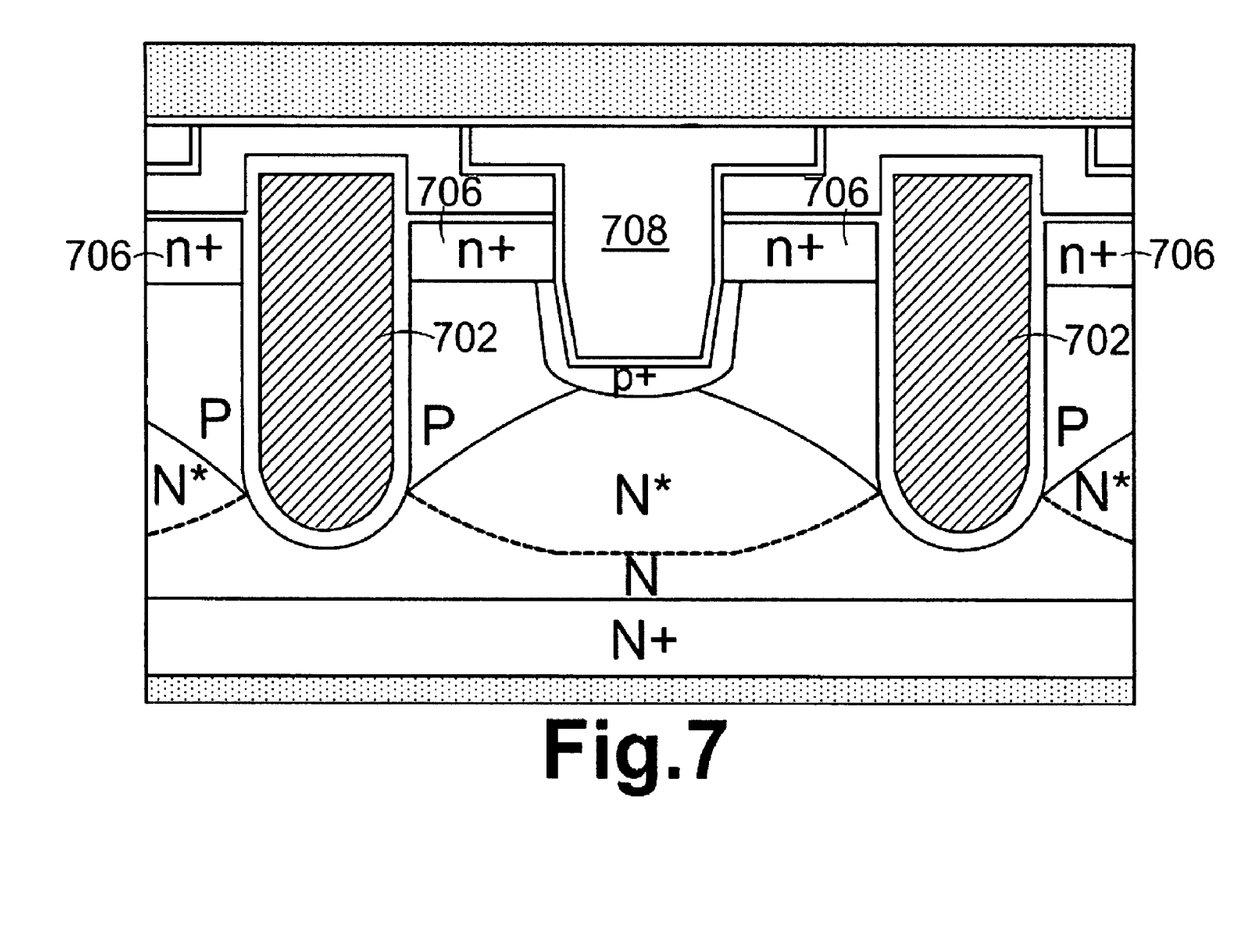
FIG. 7 is a side cross-sectional view of another preferred embodiment according to the present invention.

According to a seventh aspect of the present invention, there is provided a trench MOSFET wherein said trenched gates are filled with doped poly-silicon padded by a gate oxide layer, and said doped poly-silicon layer protrudes out from top surface of said source regions, and at least a portion of said doped poly-silicon layer is positioned higher than top surface of said source regions, as shown in FIG. 7.

Figure 4:
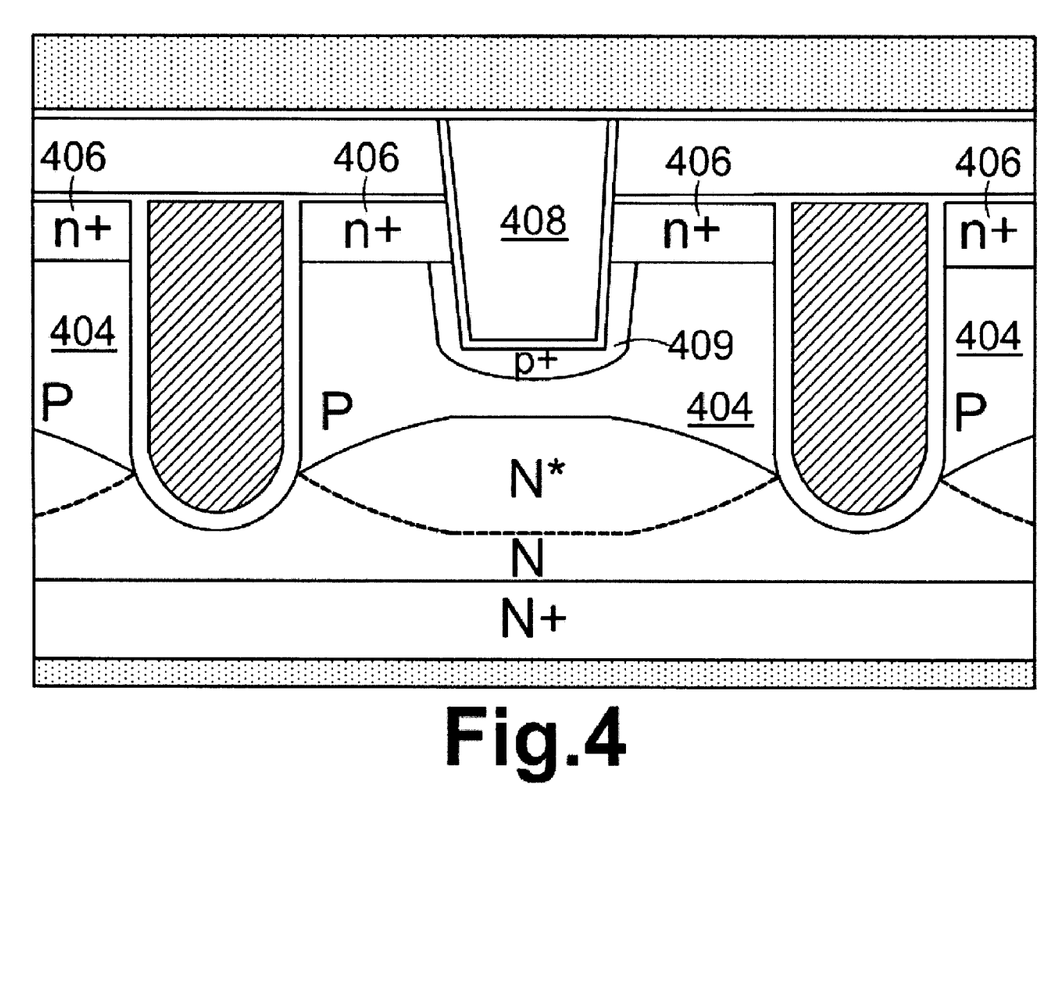
FIG. 4 is a side cross-sectional view of another preferred embodiment according to the present invention.
Figure 5:
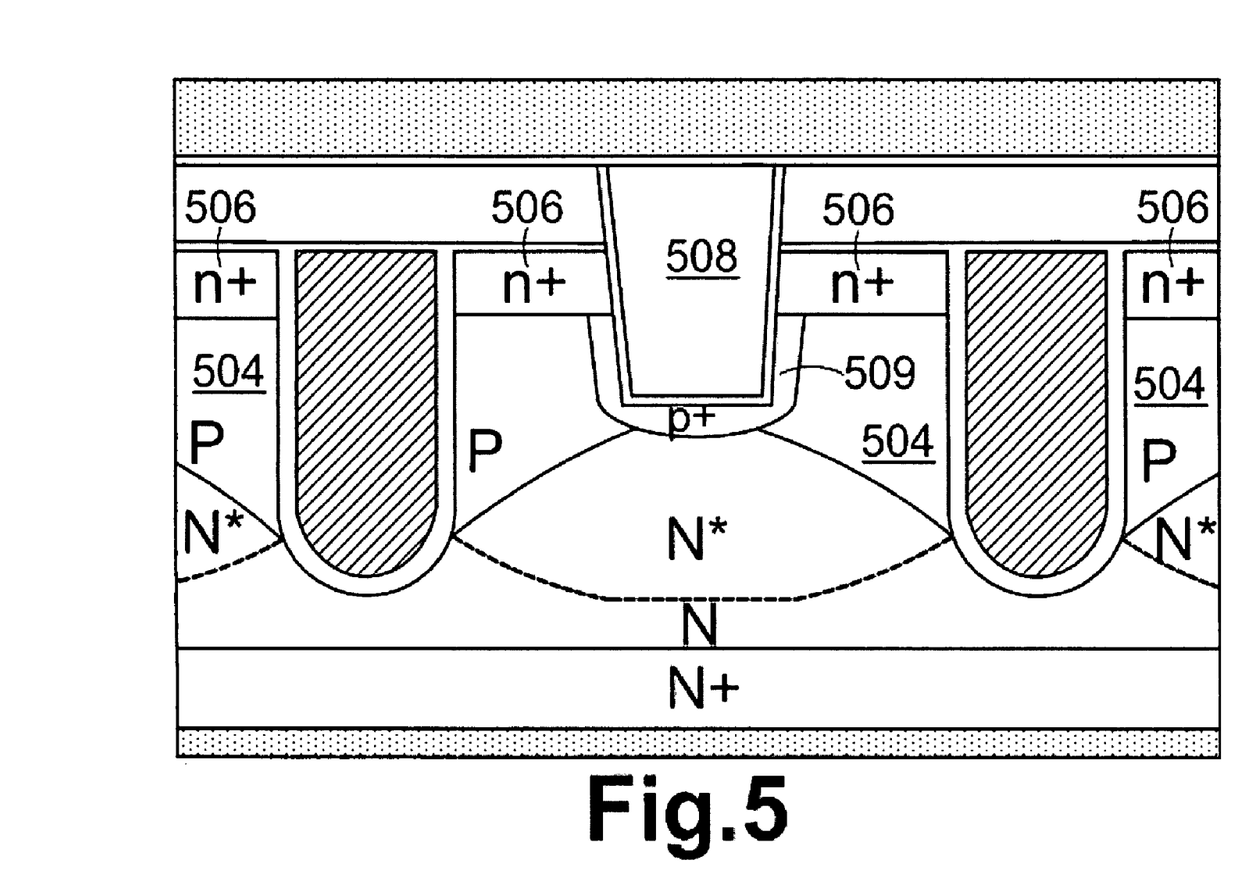
FIG. 5 is a side cross-sectional view of another preferred embodiment according to the present invention.
Figure 6:
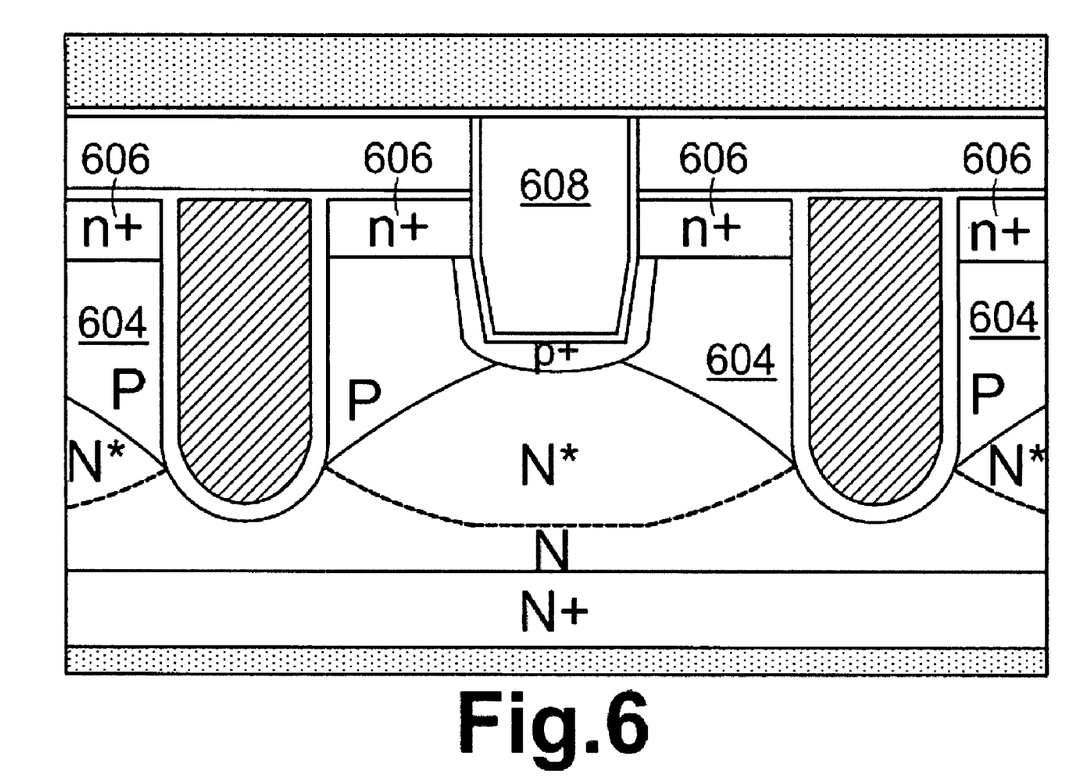
FIG. 6 is a side cross-sectional view of another preferred embodiment according to the present invention.

According to an eighth aspect of the present invention, there is provided a trench MOSFET wherein said trenched source-body contacts have vertical shape sidewalls (as shown in FIG. 2 and FIG. 3), tapered shape sidewalls (as shown in FIG. 4 and FIG. 5) or combination of vertical and tapered shape sidewalls (as shown in FIG. 6 and FIG. 7) in said source regions and said body regions.

According to a ninth aspect of the present invention, there is provided a trench MOSFET wherein said first conductivity doping type is N type and said second conductivity doping type is P type for N-channel trench MOSFET; or said first conductivity doping type is P type and said second conductivity doping type is N type for P-channel trench MOSFET.

Figure 8:
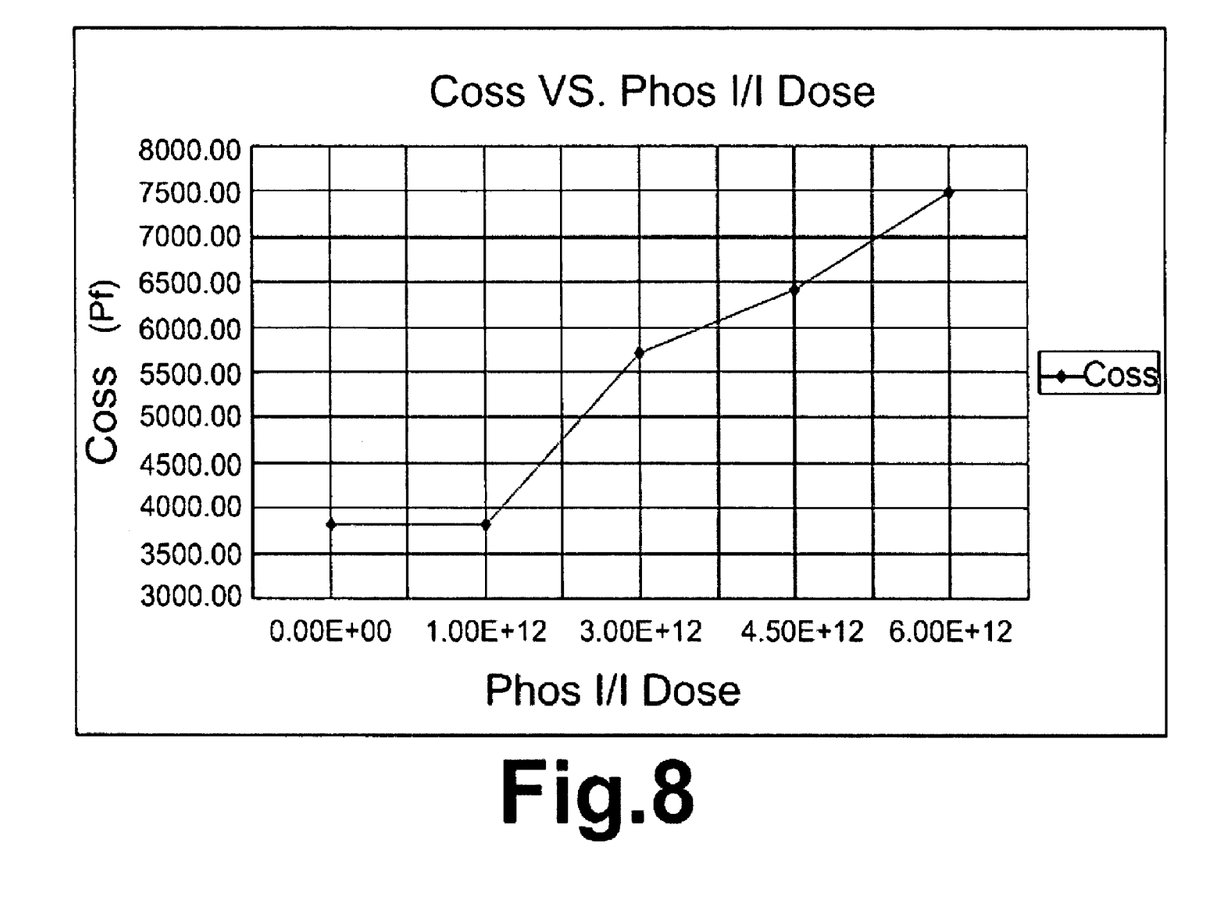
FIG. 8 is a graph showing relationship between the Coss and dose of Phosphorus ion implantation through the trenched source-body contacts.
Figure 9:
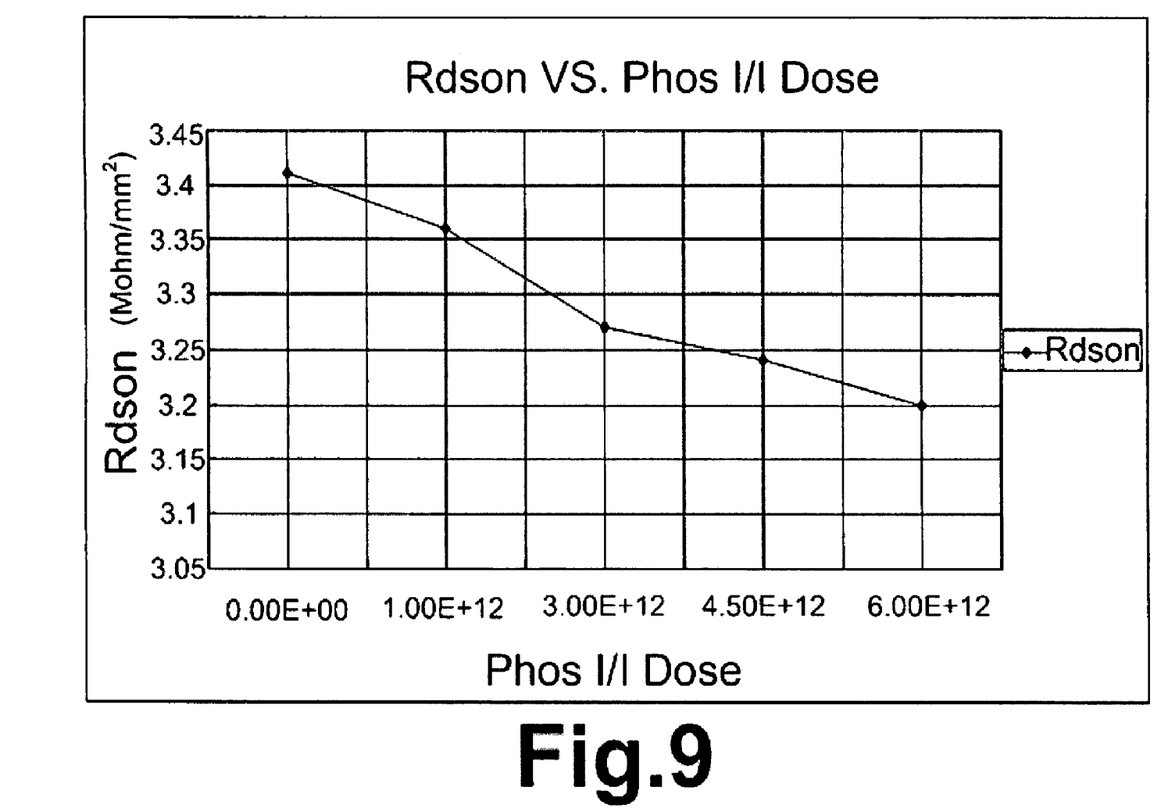
FIG. 9 is a graph showing relationship between the Rdson and dose of Phosphorus ion implantation through the trenched source-body contacts.

The advantage of present invention is that, said body regions having concave-arc shape with respect to top surface of the epitaxial layer have wider interfaced area Ba with the epitaxial layer compared with the prior art as shown in FIG. 1 having planar shape body regions. Moreover, said body regions are interfaced with Cds enhancement doped regions having higher doping concentration than the epitaxial layer, decreasing the depletion width Dw and enhancing the Cds without significantly impact breakdown voltage, please refer to FIG. 8 for relationship between the Coss and Phosphorus ion implantation dose. Furthermore, on resistance between drain and source regions Rdson is also decreased up to about 10% depending on the Phosphorus ion implantation dose, as shown in FIG. 9.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Please refer to FIG. 2 for a cross-sectional view of a preferred N-channel trench MOSFET which formed on an N+ substrate 200 with back metal 222 of Ti/Ni/Ag on rear side as drain electrode. Onto said N+ substrate 200, an N epitaxial layer 201 having doping concentration less than said N+ substrate is grown, and a plurality of trenched gates 202 filled with doped poly-silicon layer padded with a gate oxide layer are formed therein. Between every two adjacent of said trenched gates 202, a P body region 204 with concave-arc shape with respect to top surface of said epitaxial layer 201 surrounds sidewalls of said trenched gates. Underneath each said P body region 204, an N*Cds enhancement doped region 205 is formed interfaced with said P body region 204 and having a higher doping concentration than said N epitaxial layer 201. Near top surface of said P body region 204, n+ source regions 206 are formed surrounding top portion of said trenched gates with higher doping concentration than said N epitaxial layer 201. A plurality of trenched source-body contacts 208 having vertical shape sidewalls and filled with metal plugs are penetrating through a contact interlayer 207, said n+ source regions 206 and extending into said P body regions 204 with p+ body ohmic contact doped regions 209 surrounding bottoms to reduce contact resistance between the P body regions 204 and the metal plugs. Onto the contact interlayer 207, source metal 210 is deposited to be connected with said n+ source regions 206 and said P body regions 204 via metal plugs filled into said trenched contacts 208.

Please refer to FIG. 3 for a cross sectional view of another preferred N-channel trench MOSFET which is similar to that in FIG. 2 except that, in FIG. 2, the N*Cds enhancement doped region 205 is not touching to the p+ body ohmic contact doped region 209, however, in FIG. 3, the N*Cds enhancement doped region 305 is touching to the p+ body ohmic contact doped region 309.

Please refer to FIG. 4 for a cross sectional view of another preferred N-channel trench MOSFET which is similar to that in FIG. 2 except that, the trenched source-body contacts 408 in FIG. 4 have tapered shape sidewalls in the n+ source regions 406 and the P body regions 404, therefore, the p+ body ohmic contact doped regions 409 are enlarged to wrapping bottoms and sidewalls of the trenched source-body contacts 408 in the P body regions 404.

Please refer to FIG. 5 for a cross sectional view of another preferred N-channel trench MOSFET which is similar to that in FIG. 3 except that, the trenched source-body contacts 508 in FIG. 5 have tapered shape sidewalls in the n+ source regions 506 and the P body regions 504, therefore, the p+ body ohmic contact doped regions 509 are enlarged to wrapping bottoms and sidewalls of the trenched source-body contacts 508 in the P body regions 504.

Please refer to FIG. 6 for a cross sectional view of another preferred N-channel trench MOSFET which is similar to that in FIG. 5 except that, the trenched source-body contacts 608 have vertical shape sidewalls in the n+ source regions 606 and have tapered shape sidewalls in the P body regions 604.

Please refer to FIG. 7 for a cross sectional view of another preferred N-channel trench MOSFET which is similar to that in FIG. 6 except that, the doped poly-silicon layer filled in the trenched gates 702 protrudes out top surface of the n+ source regions 706, and at least of portion of the doped poly-silicon layer is positioned higher than top surface of the n+ source regions 706, therefore, the trenched source-body contacts 708 have larger top width than other portion.

Figure 10:
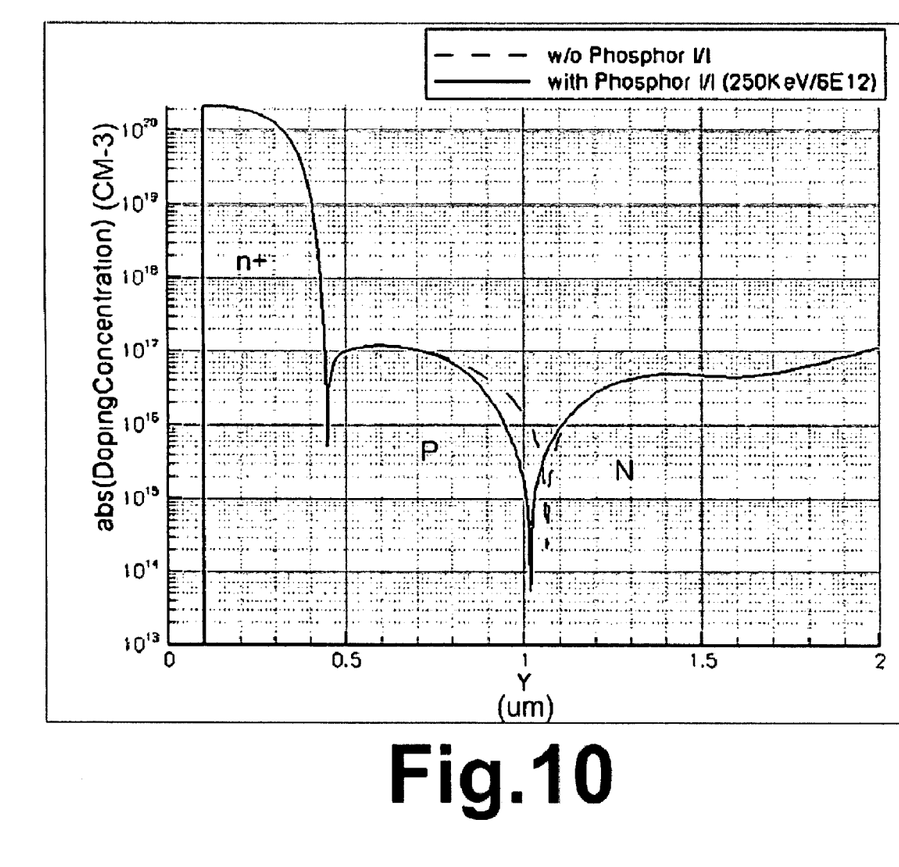
FIG. 10 is a graph showing doping concentration profile along $X_1$-$X_1'$ cross-section of FIG. 3.

Please refer to FIG. 10 for graph showing doping concentration profile along channel region near the trenched gates 302 which is $X_1$-$X_1'$ cross section in FIG. 3. The dotted line represents doping concentration profile without Phosphorus ion implantation in the prior art while the solid line represents doping concentration profile with Phosphorus ion implantation of 6E12 $cm^{-3}$ under 250 KeV.

Figure 11:
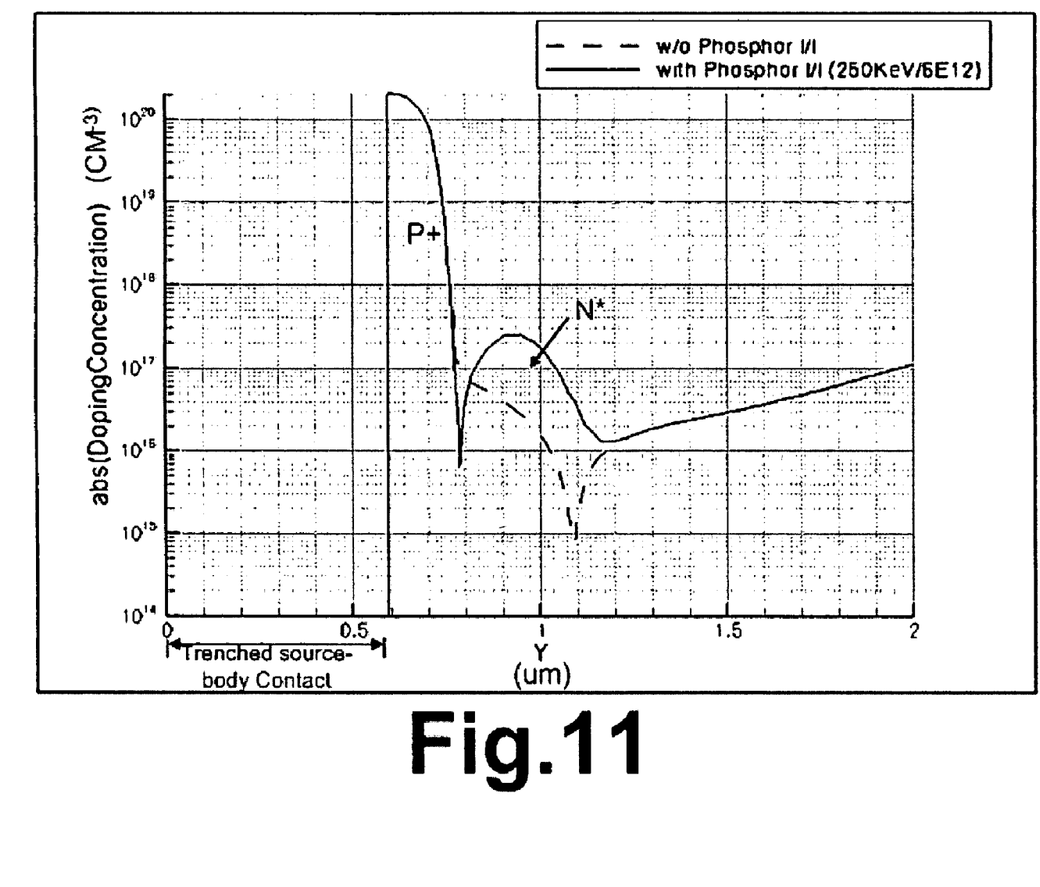
FIG. 11 is a graph showing doping concentration profile along $X_2$-$X_2'$ cross-section of FIG. 3.

Please refer to FIG. 11 for graph showing doping concentration profile under the trenched source-body contacts 308 along $X_2$-$X_2'$ cross section in FIG. 3. The dotted line represents doping concentration profile without Phosphorus ion implantation in the prior art while the solid line represents doping concentration profile with Phosphorus ion implantation of 6E12 $cm^{-3}$ under 250 KeV.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A trench MOSFET (Metal Oxide Semiconductor Field Effect Transistor) comprising:
   a substrate of a first conductivity doping type;
   an epitaxial layer of said first conductivity doping type over said substrate;

a plurality of trenched gates;
a plurality of source regions of said first conductivity doping type surrounding top portion of said trenched gates;
a plurality of body regions of a second conductivity doping type encompassing said source regions, wherein said body regions have concave-arc shape with respect to top surface of said epitaxial layer;
a plurality of Cds enhancement doped regions of said first conductivity doping type interfaced with said body regions, wherein said Cds enhancement doped regions are formed under said body regions and have higher doping concentration than said epitaxial layer;
a plurality of trenched source-body contacts; and
a plurality of body ohmic contact doped regions of said second conductivity doping type surrounding at least bottoms of said trenched source-body contacts.

2. The trench MOSFET of claim 1, wherein said Cds enhancement doped regions are not touching to said body ohmic contact doped regions.

3. The trench MOSFET of claim 1, wherein said Cds enhancement doped regions are touching to said body ohmic contact doped regions.

4. The trench MOSFET of claim 1, wherein said trenched gates are filled with doped poly-silicon padded by a gate oxide layer.

5. The trench MOSFET of claim 1, wherein said Cds enhancement doped regions are formed by ion implantation of Phosphorus through region of said trenched source-body contacts.

6. The trench MOSFET of claim 1, wherein said first conductivity doping type is N type, and said second conductivity doping type is P type for N-channel trench MOSFET.

7. The trench MOSFET of claim 1, wherein said first conductivity doping type is P type, and said second conductivity doping type is N type for P-channel trench MOSFET.

8. The trench MOSFET of claim 1, wherein said trenched source-body contacts have vertical shape sidewalls, tapered shape sidewalls or combination of vertical and tapered shape sidewalls in said source regions and said body regions.

9. The trench MOSFET of claim 1, wherein said body ohmic contact doped regions surround bottoms and sidewalls of said trenched source-body contacts in said body regions.

10. The trench MOSFET of claim 1, wherein said body ohmic contact doped regions surround only bottoms of said trenched source-body contacts in said body regions.

11. The trench MOSFET of claim 4, wherein said doped poly-silicon layer protrudes out from top surface of said source regions and at least a portion of said doped poly-silicon is positioned higher than top surface of said source regions.

12. The trench MOSFET of claim 4, wherein top surface of said doped poly-silicon layer is not higher than top surface of said source regions.

* * * * *